(12) United States Patent
Choi et al.

(10) Patent No.: US 9,484,465 B2
(45) Date of Patent: Nov. 1, 2016

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Hyun Sic Choi, Beijing (CN); Hui Li, Beijing (CN); Zhiqiang Xu, Beijing (CN); Yoon Sung Um, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/374,987

(22) PCT Filed: Dec. 9, 2013

(86) PCT No.: PCT/CN2013/088829
§ 371 (c)(1),
(2) Date: Jul. 28, 2014

(87) PCT Pub. No.: WO2014/190713
PCT Pub. Date: Dec. 4, 2014

(65) Prior Publication Data
US 2015/0325705 A1 Nov. 12, 2015

(30) Foreign Application Priority Data

May 30, 2013 (CN) .......................... 2013 1 0210510

(51) Int. Cl.
*G02F 1/1343* (2006.01)
*H01L 29/786* (2006.01)
(Continued)

(52) U.S. Cl.
CPC ....... *H01L 29/78648* (2013.01); *G02F 1/1368* (2013.01); *G02F 1/134363* (2013.01);
(Continued)

(58) Field of Classification Search
CPC ........................ H01L 29/78648; G02F 1/1368
USPC .......................................................... 257/72
See application file for complete search history.

(56) References Cited

U.S. PATENT DOCUMENTS 8,957,411 B2 2/2015 Yamazaki et al.
2004/0150762 A1* 8/2004 Segawa ............. G02F 1/136227
349/43
(Continued)

FOREIGN PATENT DOCUMENTS

CN 101013725 A 8/2007
CN 101398582 A 4/2009
(Continued)

OTHER PUBLICATIONS

Chinese Office Action of Chinese Application No. 201310210510.7, mailed Mar. 23, 2015 with English translation.
(Continued)

*Primary Examiner* — Kenneth Parker
*Assistant Examiner* — Warren H Kilpatrick
(74) *Attorney, Agent, or Firm* — Collard & Roe, P.C.

(57) ABSTRACT

A array substrate is disclosed. The array substrate includes: a substrate (10); and a first gate metal layer (111), a first gate insulating layer (121), a semiconductor layer (13) and a source-drain electrode layer (14) disposed in this order on the substrate from bottom to top. The array substrate (10) further includes a second gate insulating layer (122) disposed on the source-drain electrode layer (14); and a second gate metal layer (112) disposed on the second gate insulating layer (122). A method of manufacturing an array substrate is also disclosed.

18 Claims, 5 Drawing Sheets

(51) Int. Cl.
  *H01L 27/12*   (2006.01)
  *H01L 29/417*  (2006.01)
  *G02F 1/1368*  (2006.01)
  *G02F 1/1362*  (2006.01)

(52) U.S. Cl.
  CPC ....... *G02F1/136227* (2013.01); *H01L 27/124* (2013.01); *H01L 27/1248* (2013.01); *H01L 27/1288* (2013.01); *H01L 29/41733* (2013.01); *G02F 2001/134372* (2013.01)

(56) References Cited

U.S. PATENT DOCUMENTS

| | | |
|---|---|---|
| 2005/0062898 A1 | 3/2005 | Imayama et al. |
| 2009/0086117 A1 | 4/2009 | Chen |
| 2010/0314622 A1 | 12/2010 | Kuo et al. |
| 2011/0012112 A1 | 1/2011 | Yamazaki et al. |
| 2014/0034950 A1* | 2/2014 | Li .......................... H01L 31/02 257/53 |
| 2015/0185576 A1* | 7/2015 | Chu .................. G02F 1/136286 349/43 |

FOREIGN PATENT DOCUMENTS

| | | |
|---|---|---|
| CN | 101644866 A | 2/2010 |
| CN | 102498570 A | 6/2012 |
| CN | 102751295 A | 10/2012 |
| CN | 103309108 A | 9/2013 |
| CN | 203250095 U | 10/2013 |
| KR | 10-2008-0048739 A | 6/2008 |
| TW | 201044085 A | 12/2010 |

OTHER PUBLICATIONS

International Search Report, International Preliminary Report on Patentability and Written Opinion of the International Searching Authority of PCT/CN2013/088829 in Chinese, mailed Mar. 20, 2014.

English translation of the International Preliminary Report on Patentability and Written Opinion of the International Searching Authority of PCT/CN2013/088829, issued Dec. 1, 2015.

* cited by examiner

US 9,484,465 B2

ARRAY SUBSTRATE, MANUFACTURING METHOD THEREOF AND DISPLAY DEVICE

CROSS REFERENCE TO RELATED APPLICATIONS

This application is the National Stage of PCT/CN2013/088829 filed on Dec. 9, 2013, which claims priority under 35 U.S.C. §119 of Chinese Application No. 201310210510.7 filed on May 30, 2013, the disclosure of which is incorporated by reference.

TECHNICAL FIELD

Embodiments of the present invention relate to the display field, particularly to an array substrate and a manufacturing method thereof, and a display device.

BACKGROUND

Due to their advantages such as light weight, low power consumption, low irradiation and capability of saving space significantly, liquid crystal displays have replaced traditional cathode ray tube displays and are widely applied in various display fields such as home, public space, office locations and personal electronic products.

As illustrated in FIG. 1, a known liquid crystal display comprises display pixels (units) and thin film transistors (TFTs) for controlling display data loading, wherein the thin film transistor is generally of a bottom gate structure (gate of the thin film transistor under the semiconductor layer) comprising: a substrate 1, on which a gate metal layer 2, a gate insulating layer 3, a semiconductor layer 4 and a source-drain electrode layer 5 are disposed in this order from bottom to top; a display pixel comprises a common electrode 6, a passivation layer 8, a pixel electrode 7 and liquid crystal (on the pixel electrode 7, not shown in drawings) disposed on the passivation layer 8. The pixel electrode 7 is connected to a drain of the thin film transistor, the common electrode 6 is connected to the common electrode line 9, the pixel electrode 7 loads display data through the TFT, a driving electric field is generated between the common electrode 6 and the pixel electrode 7 and liquid crystal molecules rotate under the action of this driving electric field to display images.

With the TFT of bottom gate structure, the gate metal layer 2 blocks light emitted from the backlight source on the array substrate side, while exterior light (entering from the color filter substrate side) is blocked by the black matrix BM. The inventor found out however, when the color filter substrate and the array substrate are in misalignment, or when there is any failures in process of manufacturing the array substrate, the semiconductor layer tends to be exposed. Then TFTs' leakage current increase abnormally due to the irradiation of exterior light. As a result, the liquid crystal display encounters display defectiveness such as becoming greenish and non-uniform gray scale (X-talk).

In addition, for liquid crystal displays, particularly high resolution products, it is required to reduce resistance of common electrode, otherwise delay occurs due to the too big resistance of common electrode, and display defectiveness such as becoming greenish and non-uniform gray scale (X-talk) are likely to occur, thereby influencing the picture quality. However, if the line width of common electrode is increased to reduce resistance of common electrode, the aperture ratio will become smaller.

SUMMARY

Embodiments of the present invention provide an array substrate and a manufacturing method thereof, and a display device that can avoid display defectiveness with liquid crystal displays such as becoming greenish and non-uniform gray scale (X-talk) while not lowering transmittance, thereby improving the picture quality of display devices, particularly of high resolution products.

In order to achieve the above-mentioned purpose, embodiments of the present invention adopt the following technical solutions:

In accordance with a first aspect of the present invention, there is provided an array substrate comprising: a substrate; and a first gate metal layer, a first gate insulating layer, a semiconductor layer and a source-drain electrode layer disposed on the substrate from bottom to top in this order. The array substrate further comprises: a second gate insulating layer disposed on the source-drain electrode layer; and a second gate metal layer disposed on the second gate insulating layer.

In one example, the above-mentioned array substrate further comprises: a first common electrode line disposed in a same layer as the first gate metal layer or disposed in a same layer as the second gate metal layer.

In one example, the above-mentioned array substrate further comprises: a second common electrode line; in condition that the first common electrode line and the first gate metal layer are in same and one layer, the second common electrode line and the second gate metal layer are in same and one layer; in condition that the first common electrode line and the second gate metal layer are in same and one layer, the second common electrode line and the first gate metal layer are in same and one layer.

In one example, the second common electrode line is connected in parallel with the first common electrode line, and a line width of the second common electrode line is same as that of the first common electrode line.

In one example, the above-mentioned array substrate further comprises: a resin layer overlaying the second gate metal layer; and a first electrode and a second electrode configured for generating an electric field therebetween to drive liquid crystals, and a passivation layer disposed between the first electrode and the second electrode, the first electrode being disposed on the resin layer and the second electrode being disposed on the passivation layer.

In one example, the first electrode is connected with the first common electrode line through a via in the resin layer.

In one example, the second electrode is connected with a drain of the source-drain electrode layer through drain vias respectively in the passivation layer, the resin layer and the second gate insulating layer.

In one example, the second gate metal layer is located directly over the first gate metal layer.

According to a second aspect of the present invention, there is provided a display device comprising the above-mentioned array substrate.

In accordance with a third aspect of the present invention, there is provided a method of manufacturing an array substrate comprising: forming a first gate metal layer on a substrate; forming a first gate insulating layer on the substrate formed with the first gate metal layer; forming a semiconductor layer, a source-drain electrode layer, a second gate insulating layer and a second gate metal layer on the substrate in this order and from bottom to top, the substrate being formed with the first gate metal layer and the first gate insulating layer.

In one example, the above-mentioned method further comprises: forming a resin layer and a pattern of resin layer via on the substrate formed with the first gate metal layer, the first gate insulating layer, the semiconductor layer, the source-drain electrode layer, the second gate insulating layer and the second gate metal layer; a first transparent conductive film layer on the substrate with completion of previous step and forming a first electrode by patterning process; forming a passivation layer and a pattern of passivation layer via; forming a second transparent conductive film layer and forming a second electrode by patterning process.

In one example, the above-mentioned method further comprises: forming a first common electrode line at the same time as forming the second gate metal layer.

In one example, the above-mentioned method further comprises: forming a second common electrode line at the same time as forming the first gate metal layer.

In one example, the second common electrode lines are connected in parallel with the first common electrode lines, and a line width of the second common electrode line is same as that of the first common electrode line.

In one example, the first gate metal layer and the second gate metal layer are formed by patterning process using same and one mask.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
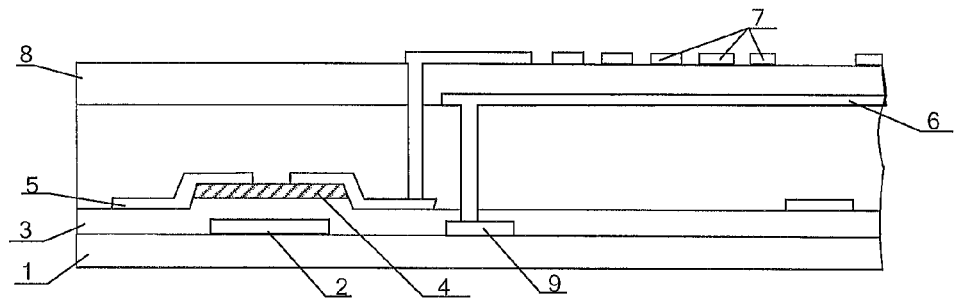
FIG. 1 is a schematically structural diagram of a known array substrate.

REFERENCE NUMERALS 1, 10—substrate, 2—gate metal layer, 3—gate insulating layer, 111—first gate metal layer, 112—second gate metal layer, 121—first gate insulating layer, 122—second gate insulating layer, 4,13—semiconductor layer, 5,14—source—drain electrode layer, 15—resin layer, 16—data line, 6,17—common electrode, 8,18—passivation layer, 9—common electrode line, 191—second common electrode line, 192—first common electrode line, 7,20—pixel electrode.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Embodiments of the present invention provide an array substrate and a manufacturing method thereof, and a display device that can mitigate display defectiveness with liquid crystal displays such as becoming greenish and non-uniform gray scale (horizontal X-talk) while not lowering transmittance, thereby improving the picture quality of display devices.

Embodiment I

Figure 2:
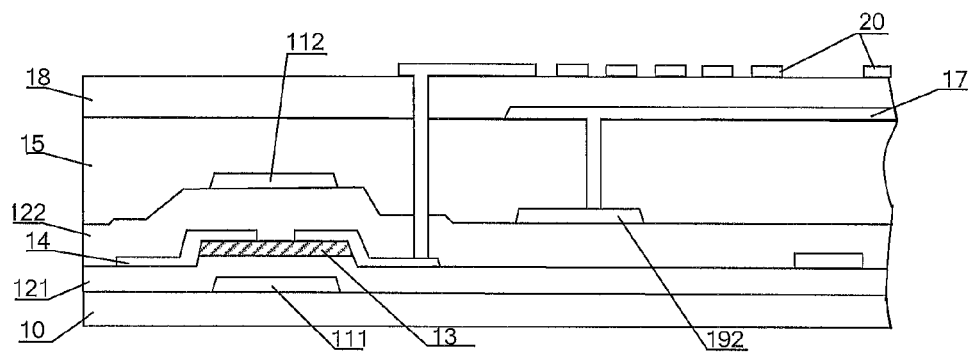
FIG. 2 is a schematically structural diagram of an array substrate provided in embodiment I of the present invention.

The embodiment of the present invention provide an array substrate as illustrated in FIG. 2, the array substrate comprises:

a substrate 10: and a first gate metal layer 111, a first gate insulating layer 121, a semiconductor layer 13, a source-drain electrode layer 14 disposed on the substrate in this order from bottom to top;

the array substrate further comprises:

a second gate insulating layer 122 disposed on the source-drain electrode layer 14; and a second gate metal layer 112 disposed on the second gate insulating layer 122.

The first gate metal layer 111 and the second gate metal layer 112 may be of the same material such as one or more selected from molybdenum, aluminum, chromium and copper. The first gate insulating layer 121 and the second gate insulating layer 122 may also be of the same material, such as silicon nitride film, and different materials may be possible of course.

In addition, each of the first gate metal layer 111 and the second gate metal layer 112 described in the present embodiment comprises patterns of a gate and a gate line. For instance, the first gate metal layer 111 and the second gate metal layer 112 have the same patterns and can be formed by photolithography with the same mask. Therefore, each of the first gate metal layer 111 and the second gate metal layer 112 comprises the gate and gate line connected with the gate.

In specific implementations, designers can select one of the following two schemes as necessary. In the first scheme, thin film transistor is of top gate structure, the gate scanning signal is applied to both the top gates and the gate line formed of the second gate metal layer 112, whereas the first gate metal layer 111 only functions to block backlight; of course the thin film transistor can also be of bottom gate structure, the gate scanning signal is applied to both the bottom gate and the gate line formed of the first gate metal layer 111, whereas the second gate metal layer 112 only functions to block exterior light. In the second schema, the thin film transistor with double channels are formed, that is, the thin film transistor is of double gate structure, the gate scanning signal is simultaneously applied to not only the gate line and the top gate formed of the second gate metal layer 112 but also the gate line and the bottom gate formed of the first gate metal layer 111. The material of the second gate insulating layer 122 and the first gate insulating layer 121 is SiNx, which function as an interface adapted for carrier movement. The double-channel thin film transistor can increase the ON current.

In the array substrate described in the present embodiment, the second gate metal layer 112 is disposed over the semiconductor layer 13, and the first gate metal layer 111 is disposed under the semiconductor layer 13. The second gate metal layer 112 over the semiconductor layer 13 blocks exterior light entering from top (entering from the color filter substrate side); the first gate metal layer 111 under the semiconductor layer 13 blocks light emitted from bottom (from the backlight source on the array substrate side), thus the semiconductor layer 13 can be prevented from being irradiated, thereby avoiding abnormal increase of leakage current of TFTs caused by irradiation. Moreover, the second gate metal layer 112 and the first gate metal layer 111 overlap with each other, allowing transmittance not decrease. In specific implementations, deviation of 3~4 μm often occurs in the process for manufacturing the array substrate, but in the embodiment, the overlay deviation of the gate metal layer is less than 1 μm, therefore the horizontal X-talk characteristic can be improved.

In summary, the array substrate described in the present embodiment can mitigate display defectiveness of liquid crystal displays such as becoming greenish and horizontal X-talk while not lowering transmittance, thereby improving the picture quality of display devices.

In one example, the array substrate further comprises: a first common electrode lines 192, which is disposed in the same layer as the second gate metal layer 112 (as illustrated in FIG. 2) or in the same layer as the first gate metal layer 111.

In one example, the array substrate further comprises: a resin layer 15 overlaying the second gate metal layer 112; and a first electrode (such as the common electrode 17 in the figure) and second electrode (such as pixel electrode 20 in the figure) which are configured for generating an electric field to drive liquid crystal, and a passivation layer 18 disposed between the first electrode and the second electrode, the first electrode (the common electrode 17) being disposed on the resin layer 15 and the second electrode (the pixel electrode 20) being disposed on the passivation layer 18.

The first electrode and the second electrode in the present embodiment may also refer to pixel electrode and common electrode, respectively. In other words, if one of them (such as the second electrode) is pixel electrode, the other (the first electrode) is common electrode. Typically, the upper electrode is a slit-like electrode, and the lower electrode is a plate-like electrode or slit-like electrode. Moreover, the second electrode (or the first electrode) functioning as the pixel electrode is connected with the drain of the above-mentioned thin film transistor, and the first electrode (correspondingly, the second electrode) functioning as the common electrode is connected with the common electrode line. For example, as illustrated in FIG. 2, the lower common electrode 17 is a plate-like electrode connected with the first common electrode lines 192 through the via in the resin layer 15. The upper pixel electrode 20 is a slit-like electrode connected with the drain of the thin film transistor through the vias respectively in the passivation layer 18, the resin layer 15 and the second gate insulating layer 122. The thin film transistor may comprises: a first gate metal layer 111, a first gate insulating layer 121, a source-drain electrode layer 14 and a semiconductor layer 13. When the display data is loaded to the pixel electrode 20 and the common electrode 17 through the thin film transistor, the pixel electrode 20 and the common electrode 17 generate a driving electric field, such that liquid crystal molecules rotate under the action of the driving electric field to display images.

The array substrate described in the present embodiment can mitigate display defectiveness of liquid crystal displays such as becoming greenish and horizontal X-talk while not lowering transmittance, thereby improving the picture quality of display devices.

Embodiment II

The embodiment of the present invention provides an array substrate that differs from embodiment I illustrated in FIG. 2 in that the array substrate further comprises: the second common electrode line.

For example, when the first common electrode line and the first gate metal layer are in the same layer, the second common electrode line and the second gate metal layer are in the same layer; and when the first common electrode line and the second gate metal layer are in the same layer, the second common electrode line and the first gate metal layer are in the same layer.

The second common electrode line is connected with the first common electrode line through the vias respectively in the first gate insulating layer and the second gate insulating layer.

Figure 3:
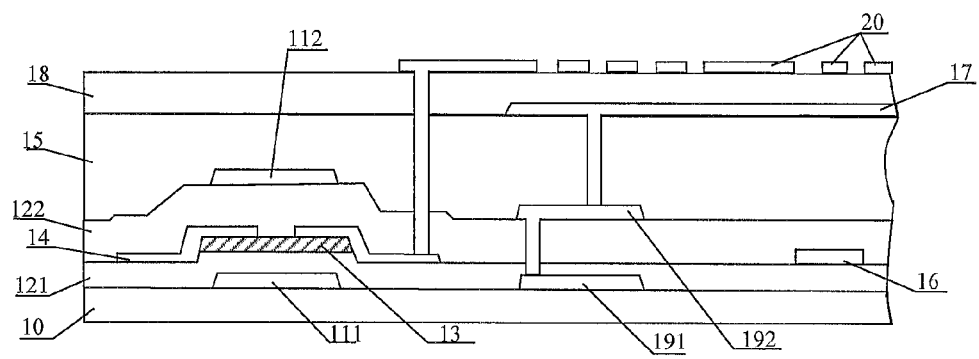
FIG. 3 is a schematically structural diagram of an array substrate provided in embodiment II of the present invention.

In order to better understand the present embodiment, one specific implementation of the present embodiment is described here. As illustrated in FIG. 3, the array substrate comprises: a substrate 10; and a first gate metal layer 111, a first gate insulating layer 121, a semiconductor layer 13, a source-drain electrode layer 14, a second gate insulating layer 122 and a second gate metal layer 112 disposed in this order on the substrate 10 from bottom to top. Besides, the array substrate further comprises:

a first common electrode line 192 in the same layer as the second gate metal layer 112;

a second common electrode line 191 in the same layer as the first gate metal layer 111;

wherein the second common electrode line 191 are connected with the first common electrode line 192 through the vias respectively in the first gate insulating layer 121 and the second gate insulating layer 122.

In the present embodiment, the first common electrode line 192 and the second gate metal layer 112 are in the same layer, both of them may be made of the same metal film layer and formed simultaneously by resist application, exposure, etching and development steps. Similarly, the second common electrode line 191 and the first gate metal layer 111 are also in the same layer, both of them may be made of the same metal film layer and formed simultaneously.

The common electrode has too large resistance, which would cause delay and hence influence the picture quality, and display defectiveness of liquid crystal display devices such as becoming greenish and horizontal X-talk are likely to occur, thereby influencing the picture quality. Increasing width of common electrode or using low resistance materials to form common electrode may reduce resistance of common electrode. However, increasing width of common electrode will influence aperture ratio of pixels; while using low resistance materials can only reduce resistance of common electrode to a limited extent and may require modification of the manufacturing process, hence lacking practicability.

Whereas in the present embodiment, the additional electrode line, i.e., the second common electrode line 191, are formed under the thin film transistor and the second common electrode line 191 have a line width less than or equal to that of the first common electrode line 192. The second common electrode line 191 are connected in parallel with the first common electrode line 192, and the second common electrode line 191 overlap the first common electrode line 192 and block each other. Therefore, resistance of common electrode can be reduced without influencing aperture ratio of pixels and increasing line width, thereby avoiding delay caused by the too large resistance of common electrode, which is particularly important for display device, especially for high resolution products. For instance, the second common electrode line 191 are connected in parallel with the first common electrode line 192, and the line width of the second common electrode line 191 is the same as that of the first common electrode line 192.

In one example, the array substrate further comprises: data lines 16 in the same layer as the source-drain electrode layer 14 of thin film transistor.

In one example, the array substrate further comprises:
a resin layer 15 overlaying the second gate metal layer 112; and
a pixel electrode 20 and a common electrode 17 which are configured for generating an electric field to drive liquid crystal, and a passivation layer 18 disposed between the pixel electrode 20 and the common electrode 17, the common electrode 17 being disposed on the resin layer 15 and the pixel electrode 20 being disposed on the passivation layer 18.

Optionally, the common electrode 17 are connected with the first common electrode line 192 through the via in the resin layer 15; the pixel electrode 20 are connected with the source-drain metal layer 14 (e.g. the drain of the thin film transistor) through the vias respectively in the passivation layer 18, the resin layer 15 and the second gate insulating layer 122 under the resin layer 15. Upper pixel electrode 20 is a slit-like electrode and lower common electrode 17 is a plate-like or a slit-like electrode.

In addition, it is to be noted that what is connected with the drain in the present embodiment is the pixel electrode, what is connected with common electrode line is the common electrode, the common electrode and the pixel electrode may be exchanged in position, but the upper electrode remains a slit-like electrode and the lower electrode remains a plate-like or slit-like electrode.

With the array substrate provided in the present embodiment, due to the blocking achieved by the first gate metal layer and the second gate metal layer, abnormal increase of TFT leakage current due to light irradiation of the semiconductor layer can be avoided; at the same time, applying an overlapping double line structure of the first and second common electrode line may reduce resistance of common electrode without influencing aperture ratio of pixels and avoid delay caused by the too large resistance of common electrode. Therefore, the array substrate described in the present embodiment can mitigate display defectiveness of liquid crystal displays such as becoming greenish and horizontal X-talk while not lowering transmittance, thereby improving the picture quality of display devices.

Embodiment III

The embodiment of the present invention further provides a display device, which comprises any one of the array substrates described in embodiments I and II. The display devices may be any products or components with display functions, such as liquid crystal panels, electronic paper, OLED panels, mobile telephones, flat computers, TVs, displays, notebook computers, digital picture frames, and navigators.

Because adopting the array substrate described in the present invention, the display device described in the present embodiment can mitigate display defectiveness of liquid crystal displays such as becoming greenish and horizontal X-talk while not lowering transmittance, thereby improving the display effect.

Embodiment IV

Figure 4:
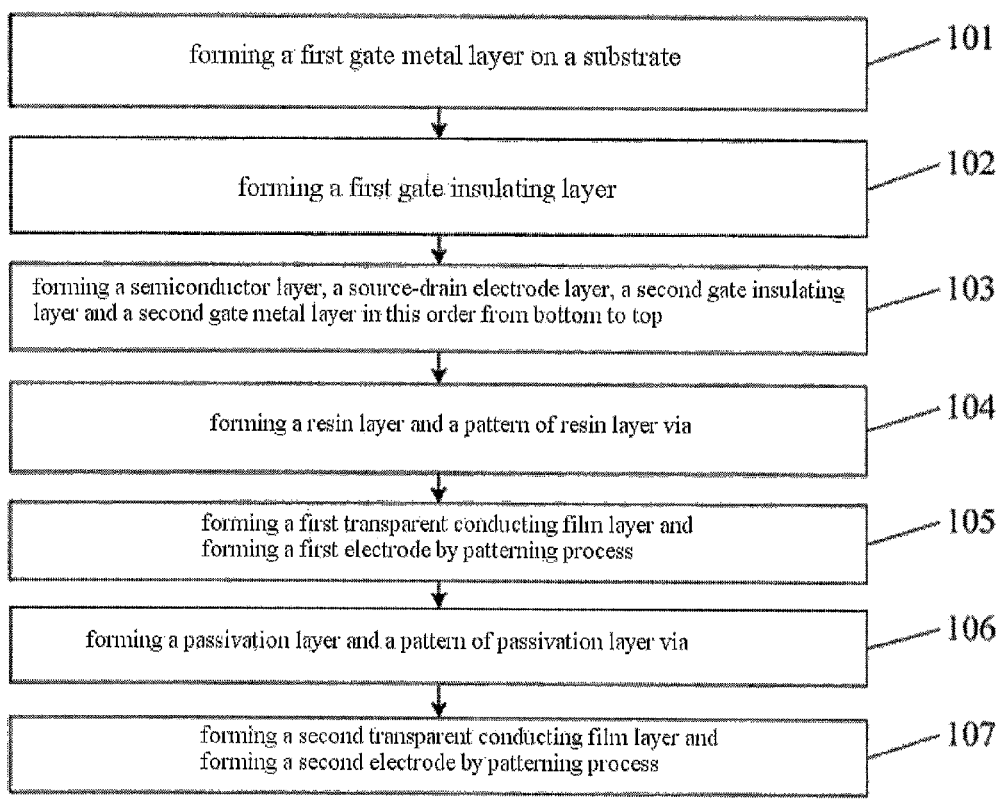
FIG. 4 is a flow chart of a manufacturing method of an array substrate provided in embodiment IV of the present invention.
Figure 5:
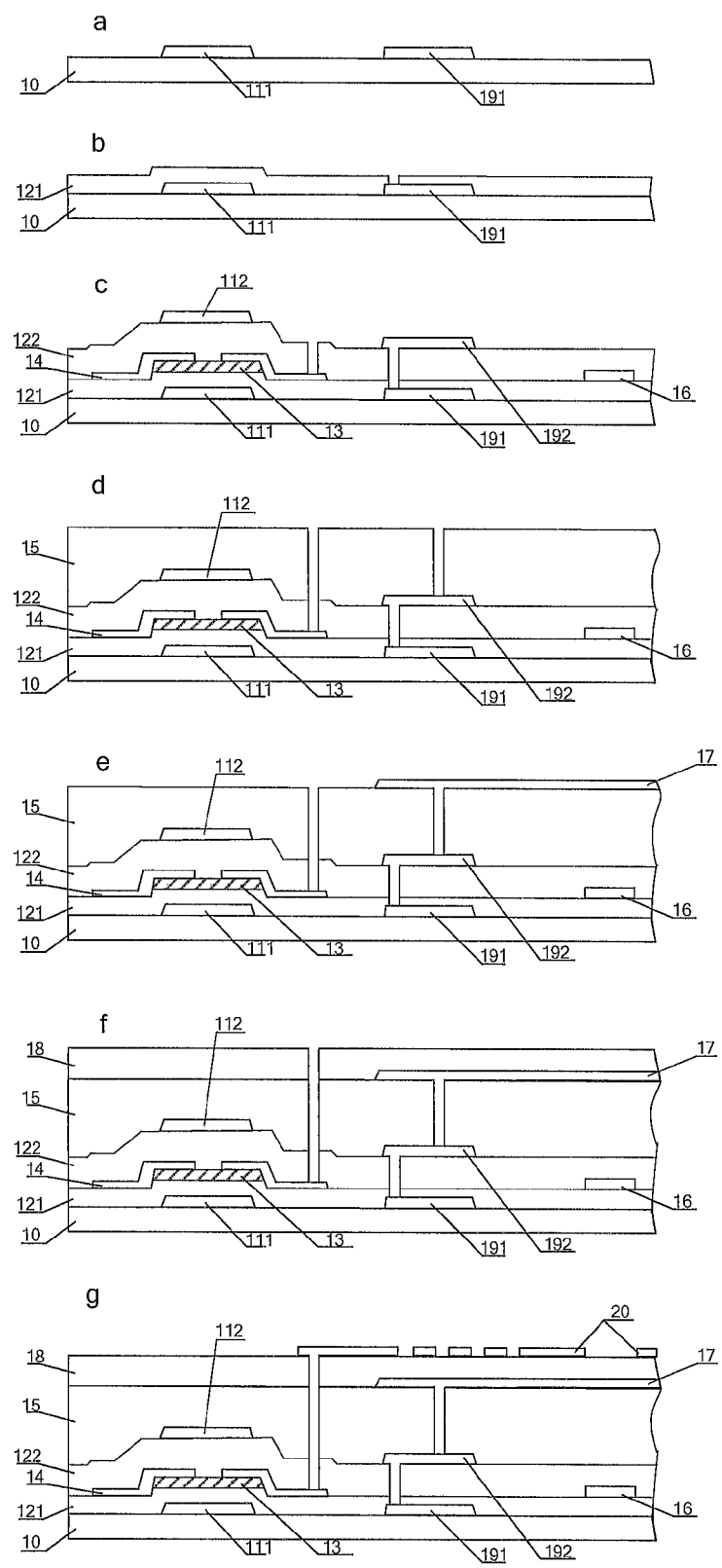
FIGS. 5a to 5g are schematically sectional diagrams of a substrate in a manufacturing method of an array substrate in embodiment IV of the present invention.

The embodiment of the present invention further provides a manufacturing method of an array substrate as illustrated in FIGS. 4 and 5, the method comprises the following steps:

101. forming a first gate metal layer 111 on a substrate 10 (FIG. 5a);

As illustrated in FIG. 3, the array substrate in the present embodiment may further comprise the first common electrode line 192 and the second common electrode line 191, wherein the second common electrode line 191 may be in the same layer as the first gate metal layer 111. For example, a gate metal film layer is formed on the substrate 10 with deposition, coating, sputtering and the like, then a pattern of first gate metal layer 111 (comprising patterns of a gate and a gate line) and a pattern of the second common electrode line 191 are formed on the substrate 10 by coating photoresist, exposure, development and etching steps.

102. forming a first gate insulating layer 121 on the substrate completing step 101 (FIG. 5b);

The first gate insulating layer 121 is the same as the gate insulating layer 3 illustrated in FIG. 1 in their patterns, therefore for this step, it is possible to form a via in the first gate insulating layer 121 with a same mask as the one used for forming the gate insulating layer 3, such that the second common electrode line 191 is exposed. Of course, it is also possible to form the via without mask, as long as the first gate insulating layer is formed. Materials of the first and second gate insulating layers in the present embodiment are insulating material, such as SiNx.

103. forming a semiconductor layer 13, a source-drain electrode layer 14, a second gate insulating layer 122 and a second gate metal layer 112 in this order on the substrate completing step 102 from bottom to top; wherein the source-drain electrode layer 14 comprises patterns of source electrode, drain electrode, and data line (FIG. 5c);

When forming the second gate metal layer 112, the mask used for forming the first gate metal layer 111 of thin film transistor in step 103 may be used in this step, such that the widths of the two gate metal layers are the same. When forming the second gate insulating layer 122, it is possible to form a drain via in the second gate insulating layer 122 with the mask simultaneously, so as to expose the drain of thin film transistor.

Optionally, as illustrated in FIG. 3, if the array substrate further comprises first common electrode line 192 in the same layer as the second gate metal layer 112 and the first common electrode line 192 are connected with the second common electrode line 191 through the vias respectively in the second gate insulating layer 122 and the first gate insulating layer 121, then the second gate insulating layer 122 and the first common electrode line 192 are formed simultaneously in this step. Moreover, the step further comprises: forming the connection vias which connect the second common electrode line 191 with the first common electrode line 192.

In this step, the semiconductor layer 13, the source-drain electrode layer 14, the second gate insulating layer 122 and the second gate metal layer 112 are respectively made of known suitable materials, and their manufacturing process comprises, for example: forming the semiconductor layer by the second patterning process, forming the source-drain electrode layer 14 by the third patterning process, forming the connection via (for connecting lines 191 and 192) and the drain via in the second gate insulating layer 122 by the fourth patterning process, and forming the second gate metal layer 112 by the fifth patterning process.

In this step, two vias need to be formed in the second gate insulating layer 122, therefore the mask used in this step may be same as the mask used for forming the resin layer 15 in step 104.

104. forming a resin layer and a pattern of the resin layer via on the substrate completing step 103 (FIG. 5d);

Forming a pattern of the resin layer via refers to forming a connection via for connecting the common electrode 17 with the first common electrode line 192. Further, it is possible to further form a drain via in the resin layer at the same time as forming the connection via, thereby reducing etching time and etching difficulty. The drain via is used to connect the pixel electrode and the drain of thin film transistor.

105. forming a first transparent conductive film layer on the substrate completing step 104, and forming a first electrode by patterning process (FIG. 5e). In FIG. 5e, the first electrode is common electrode 17, the common electrode 17 are connected with the first common electrode line 192 through the via in the resin layer 15 over the first common electrode line 192.

106. forming a passivation layer 18 and a pattern of the passivation layer via on the substrate completing step 105 (FIG. 5f);

There are two schemes for forming a pattern of the passivation layer via in this step: the first one is to form a drain via penetrating through the passivation layer 18, the resin layer 15 and the second gate insulating layer 122 so as to expose the drain; the second one is to form drain vias respectively, that is, a drain via is formed in the resin layer 15 first, and then another drain via is formed in the passivation layer 18.

107. forming a second transparent conductive film layer on the substrate completing step 106 and forming a second electrode by patterning process (FIG. 5g).

As illustrated in FIG. 5g, the second electrode is the pixel electrode 20 and the pixel electrode 20 is connected with the drain of the thin film transistor through the vias respectively in the passivation layer 18, the resin layer 15 and the second gate insulating layer 122.

In the above mentioned manufacturing method, both the first and second gate metal layers formed in steps 101~103 serve as blocking layers for the semiconductor layer of thin film transistor, and can avoid abnormal increase of leakage current of TFTs due to light irradiation on the semiconductor layer. Therefore, the array substrate described in the present embodiment can mitigate display defectiveness of liquid crystal displays such as becoming greenish and horizontal X-talk while not lowering transmittance and improve the picture quality of display devices. Further, the array substrate is further provided with a laminated structure of first common electrode line and second common electrode line, which can reduce the resistance of common electrode while not influencing aperture ratio of pixels and avoid delay due to too large resistance of common electrode. With the manufacturing method of the array substrate provided in the present embodiment, it is not required to introduce any new mask, therefore no significant modifications are needed for the manufacturing method and equipment.

In the above-mentioned method, the second electrode (the pixel electrode 20 in the figure) may be a slit-like electrode.

Figure 6:
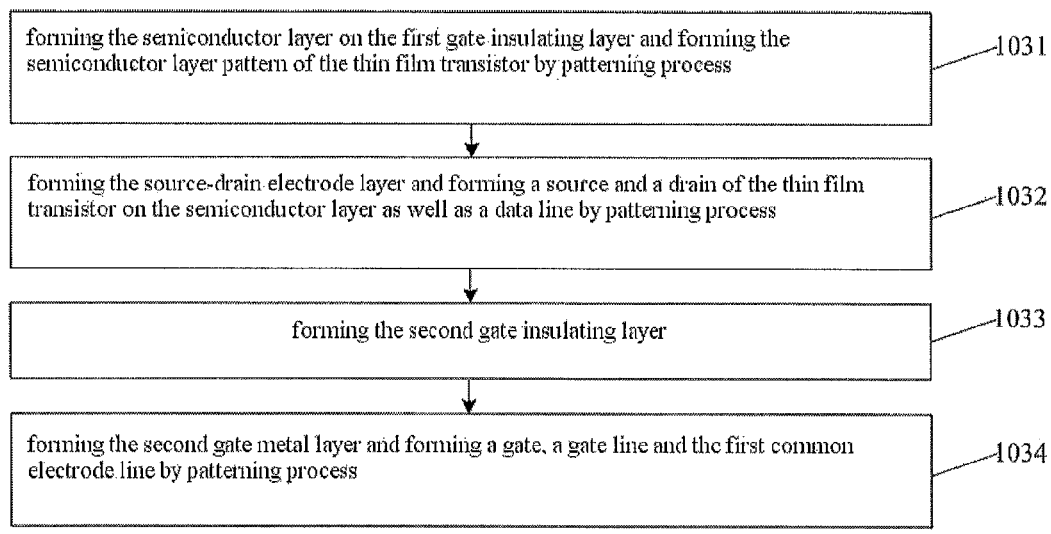
FIG. 6 is a flow chart of step 103 in FIG. 4.
Figure 7:
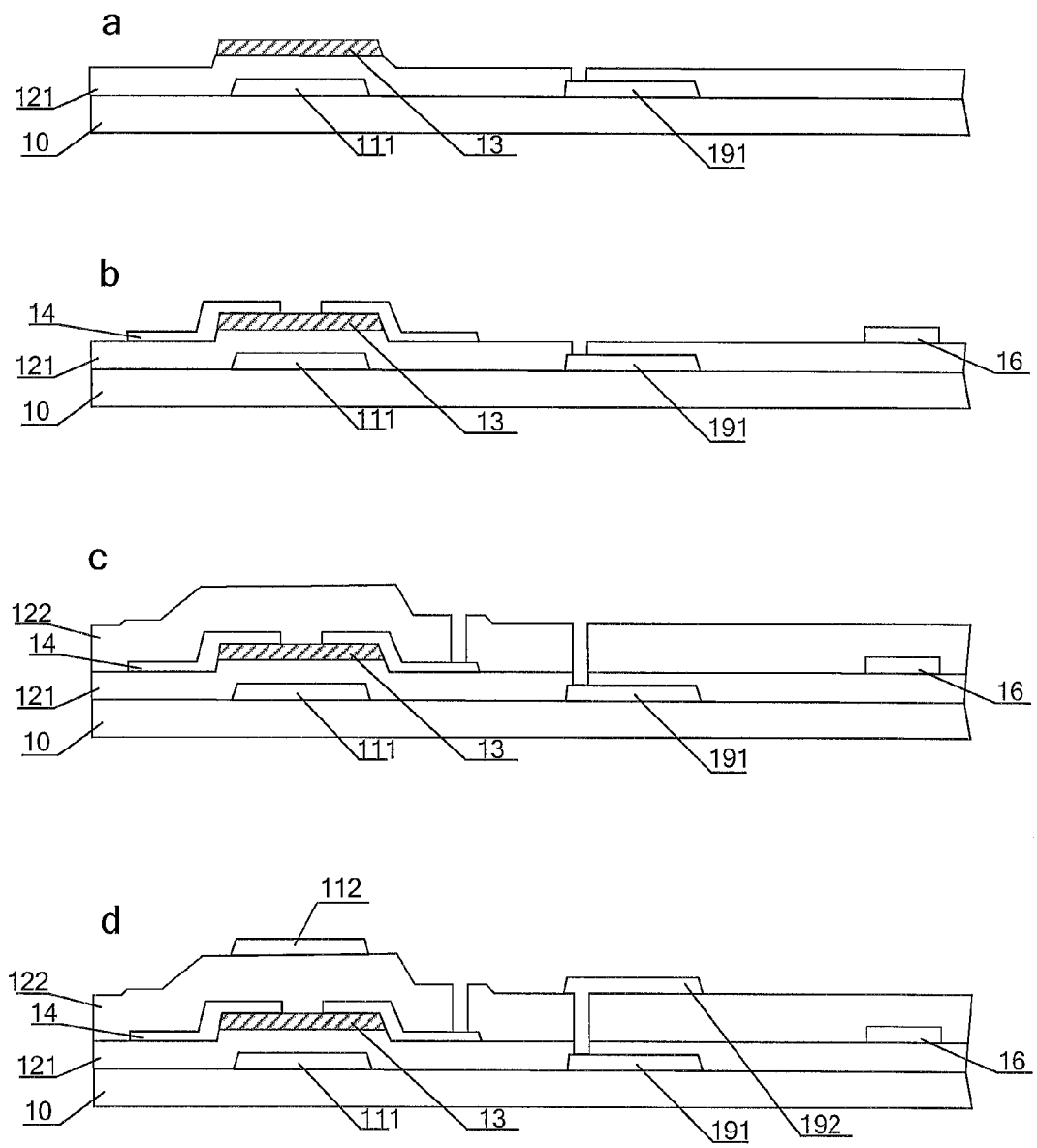
FIGS. 7a to 7d are schematically sectional diagrams of a substrate during a manufacturing procedure of step 103 in FIG. 4.

In the above-mentioned method, as illustrated in FIG. 6, step 103 may comprise the following steps:

1031. forming a semiconductor layer 13 on the first gate insulating layer 121 and forming the semiconductor layer pattern of the thin film transistor by patterning process (FIG. 7a);

1032. forming a source-drain electrode layer 14 and forming a source and a drain of the thin film transistor on the semiconductor layer 13 as well as a data line 16 by patterning process (FIG. 7b);

1033. forming a second gate insulating layer 122 (FIG. 7c);

1034. forming a second gate metal layer 112 and forming a gate, a gate line and a first common electrode line 192 by patterning process (FIG. 7d), wherein the first common electrode line 192 is located at a position over the second common electrode line 191.

With the manufacturing method of array substrate provided in the present embodiment, it is not necessary to introduce any new mask, the formed array substrate can mitigate display defectiveness with liquid crystal displays such as becoming greenish and horizontal X-talk while not lowering transmittance, thereby improving the picture quality of display devices.

It is to be noted that in embodiments of the present invention, sequence numbers of the steps are not intended to limit the order of the steps. Those skilled in the art can modify the order of steps without any creative labors, which also falls into the protection scope of the present invention. Technical features described in embodiments of the present invention may be combined as desired.

What are described above is related to the illustrative embodiments of the disclosure only and not limitative to the scope of the disclosure; the scopes of the disclosure are defined by the accompanying claims.

The invention claimed is:

1. An array substrate, comprising: a substrate; and a first gate metal layer, a first gate insulating layer, a semiconductor layer and a source-drain electrode layer disposed in this order on the substrate from bottom to top; the array substrate further comprising:
    a second gate insulating layer disposed on the source-drain electrode layer;
    a second gate metal layer disposed on the second gate insulating layer;
    a first common electrode line disposed in a same layer as the first gate metal layer or disposed in a same layer as the second gate metal layer; and
    a second common electrode line, wherein:
    in condition that the first common electrode line and the first gate metal layer are in same and one layer, the second common electrode line and the second gate metal layer are in same and one layer; and
    in condition that the first common electrode line and the second gate metal layer are in same and one layer, the second common electrode line and the first gate metal layer are in same and one layer.

2. The array substrate of claim 1, wherein the second common electrode line is connected in parallel with the first common electrode line, and a line width of the second common electrode line is same as that of the first common electrode line.

3. The array substrate of claim 1, further comprising:
    a resin layer overlaying the second gate metal layer; and
    a first electrode and a second electrode configured for generating an electric field therebetween to drive liquid crystals, and a passivation layer disposed between the first electrode and the second electrode, the first electrode being disposed on the resin layer and the second electrode being disposed on the passivation layer.

4. The array substrate of claim 3, wherein the first electrode is connected with the first common electrode line through a via in the resin layer.

5. The array substrate of claim 3, wherein the second electrode is connected with a drain of the source-drain electrode layer through drain vias respectively in the passivation layer, the resin layer and the second gate insulating layer.

6. The array substrate of claim 5, wherein the second gate metal layer is located directly over the first gate metal layer.

7. A display device, comprising the array substrate of claim 1.

8. A method of manufacturing an array substrate, comprising:
    forming a first gate metal layer on a substrate;
    forming a first gate insulating layer on the substrate formed with the first gate metal layer;
    forming a semiconductor layer, a source-drain electrode layer, a second gate insulating layer and a second gate metal layer on the substrate in this order and from bottom to top, the substrate being formed with the first gate metal layer and the first gate insulating layer; and
    forming a first common electrode line at the same time as forming the second gate metal layer.

9. The method of claim 8, further comprising:
    forming a resin layer and a pattern of a resin layer via on the substrate formed with the first gate metal layer, the first gate insulating layer, the semiconductor layer, the source-drain electrode layer, the second gate insulating layer and the second gate metal layer;
    forming a first transparent conductive film layer on the substrate with completion of previous step and forming a first electrode by patterning process;
    forming a passivation layer and a pattern of passivation layer via;
    forming a second transparent conductive film layer and forming a second electrode by patterning process.

10. The method of claim 8, further comprising: forming a second common electrode line at the same time as forming the first gate metal layer.

11. The method of claim 10, wherein the second common electrode line are connected in parallel with the first common electrode line, and a line width of the second common electrode line is same as that of the first common electrode line.

12. The method of claim 9, wherein the first gate metal layer and the second gate metal layer are formed by patterning process using same and one mask.

13. The method of claim 8, wherein the first gate metal layer and the second gate metal layer are formed by patterning process using same and one mask.

14. An array substrate, comprising: a substrate; and a first gate metal layer, a first gate insulating layer, a semiconductor layer and a source-drain electrode layer disposed in this order on the substrate from bottom to top; the array substrate further comprising:
    a second gate insulating layer disposed on the source-drain electrode layer;
    a second gate metal layer disposed on the second gate insulating layer; and
    a first common electrode line disposed in a same layer as one of the first gate metal layer and the second gate metal layer;
    a resin layer overlaying the second gate metal layer; and
    a first electrode and a second electrode configured for generating an electric field therebetween to drive liquid crystals, and a passivation layer disposed between the first electrode and the second electrode, the first electrode being disposed on the resin layer and the second electrode being disposed on the passivation layer,
    wherein the first electrode is connected with the first common electrode line through a via in the resin layer.

15. The array substrate of claim 14, further comprising: a second common electrode line, wherein:
    in condition that the first common electrode line and the first gate metal layer are in same and one layer, the second common electrode line and the second gate metal layer are in same and one layer; and
    in condition that the first common electrode line and the second gate metal layer are in same and one layer, the second common electrode line and the first gate metal layer are in same and one layer.

16. The array substrate of claim 15, wherein the second common electrode line is connected in parallel with the first common electrode line, and a line width of the second common electrode line is same as that of the first common electrode line.

17. The array substrate of claim 14, wherein the second electrode is connected with a drain of the source-drain electrode layer through drain vias respectively in the passivation layer, the resin layer and the second gate insulating layer.

18. The array substrate of claim 14, wherein the second gate metal layer is located directly over the first gate metal layer.

* * * * *